(12) United States Patent  
Hung et al.

(10) Patent No.: US 8,779,452 B2  
(45) Date of Patent: Jul. 15, 2014

(54) CHIP PACKAGE

(76) Inventors: Tzu-Hsiang Hung, Kaohsiung (TW); 
Hsin-Chih Chiu, New Taipei (TW); 
Chuan-Jin Shiu, Zhongli (TW); 
Chia-Sheng Lin, Zhongli (TW); 
Yen-Shih Ho, Kaohsiung (TW); Yu-Min Liang, Zhongli (TW)

( * ) Notice: Subject to any disclaimer, the term of this patent is extended or adjusted under 35 U.S.C. 154(b) by 79 days.

(21) Appl. No.: 13/224,267

(22) Filed: Sep. 1, 2011

(65) Prior Publication Data  
US 2012/0056226 A1 Mar. 8, 2012

Related U.S. Application Data

(60) Provisional application No. 61/379,674, filed on Sep. 2, 2010.

(51) Int. Cl.  
*H01L 29/22* (2006.01)

(52) U.S. Cl.  
USPC ........ 257/98; 257/99; 257/737; 257/E31.112; 257/E33.072

(58) Field of Classification Search  
USPC ............... 257/98, 99, 737, E31.112, E33.072  
See application file for complete search history.

(56) References Cited

U.S. PATENT DOCUMENTS

| 6,630,736 | B1 | 10/2003 | Ignaut |
| 7,352,066 | B2 | 4/2008 | Budd et al. |
| 2007/0235882 | A1 | 10/2007 | Sekiguchi et al. |
| 2009/0096051 | A1 | 4/2009 | Sugiyama et al. |
| 2010/0033647 | A1* | 2/2010 | Okita et al. ............... 349/57 |
| 2011/0298000 | A1* | 12/2011 | Liu et al. ............... 257/99 |

FOREIGN PATENT DOCUMENTS

| CN | 1975544 | 6/2007 |
| CN | 101419952 | 4/2009 |
| CN | 102119442 | 7/2011 |

* cited by examiner

*Primary Examiner* — Andy Huynh  
(74) *Attorney, Agent, or Firm* — Liu & Liu

(57) ABSTRACT

An embodiment of the invention provides a chip package which includes: a substrate having a first surface and a second surface; an optoelectronic device disposed at the first surface; a protection layer disposed on the second surface of the substrate, wherein the protection layer has an opening; a conducting bump disposed on the second surface of the substrate and filled in the opening; a conducting layer disposed between the protection layer and the substrate, wherein the conducting layer electrically connects the optoelectronic device to the conducting bump; and a light shielding layer disposed on the protection layer, wherein the light shielding layer does not contact with the conducting bump.

21 Claims, 5 Drawing Sheets

CHIP PACKAGE

CROSS REFERENCE TO RELATED APPLICATIONS

This application claims the benefit of U.S. Provisional Application No. 61/379,674, filed on Sep. 2, 2010, the entirety of which is incorporated by reference herein.

BACKGROUND OF THE INVENTION

1. Field of the Invention

The present invention relates to a chip package, and in particular relates to an optoelectronic device chip package.

2. Description of the Related Art

Optoelectronic devices such as light sensing devices or light emitting devices play important roles in image capture or illumination applications. The optoelectronic devices have been widely used in the applications of, for example, digital cameras, digital video recorders, mobile phones, solar cells, monitors, or lighting equipments.

Along with advancements in technological development, requirements for light sensing precision of light sensing devices or light emitting precision of light emitting devices have accordingly been increased.

BRIEF SUMMARY OF THE INVENTION

An embodiment of the invention provides a chip package which includes: a substrate having a first surface and a second surface; an optoelectronic device disposed at the first surface; a protection layer disposed on the second surface of the substrate, wherein the protection layer has an opening; a conducting bump disposed on the second surface of the substrate and filled in the opening; a conducting layer disposed between the protection layer and the substrate, wherein the conducting layer electrically connects the optoelectronic device to the conducting bump; and a light shielding layer disposed on the protection layer, wherein the light shielding layer does not contact with the conducting bump.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

The manufacturing method and method for use of the embodiment of the invention are illustrated in detail as followed. It is understood, that the following disclosure provides many different embodiments, or examples, for implementing different features of the invention. Specific examples of components and arrangements are described below to simplify the present disclosure. These are, of course, merely examples and are not intended to be limiting. In addition, the present disclosure may repeat reference numbers and/or letters in the various examples. This repetition is for the purpose of simplicity and clarity and does not in itself dictate a relationship between the various embodiments and/or configurations discussed. Furthermore, descriptions of a first layer "on," "overlying," (and like descriptions) a second layer, include embodiments where the first and second layers are in direct contact and those where one or more layers are interposing the first and second layers.

A chip package according to an embodiment of the present invention may be used to package a light sensing device or a light emitting device. However, embodiments of the invention are not limited thereto. For example, the chip package of the embodiments of the invention may be applied to active or passive devices, or electronic components with digital or analog circuits, such as opto electronic devices, micro electro mechanical systems (MEMS), micro fluidic systems, and physical sensors for detecting heat, light, or pressure. Particularly, a wafer scale package (WSP) process may be applied to package semiconductor chips, such as image sensor devices, light-emitting diodes (LEDs), solar cells, RF circuits, accelerators, gyroscopes, micro actuators, surface acoustic wave devices, pressure sensors, ink printer heads, or power MOSFET modules.

The wafer scale package process mentioned above mainly means that after the package process is accomplished during the wafer stage, the wafer with chips is cut to obtain separate independent packages. However, in a specific embodiment, separate independent chips may be redistributed overlying a supporting wafer and then be packaged, which may also be referred to as a wafer scale package process. In addition, the above mentioned wafer scale package process may also be adapted to form chip packages of multi-layer integrated circuit devices by stacking a plurality of wafers having integrated circuits.

Figure 1A:
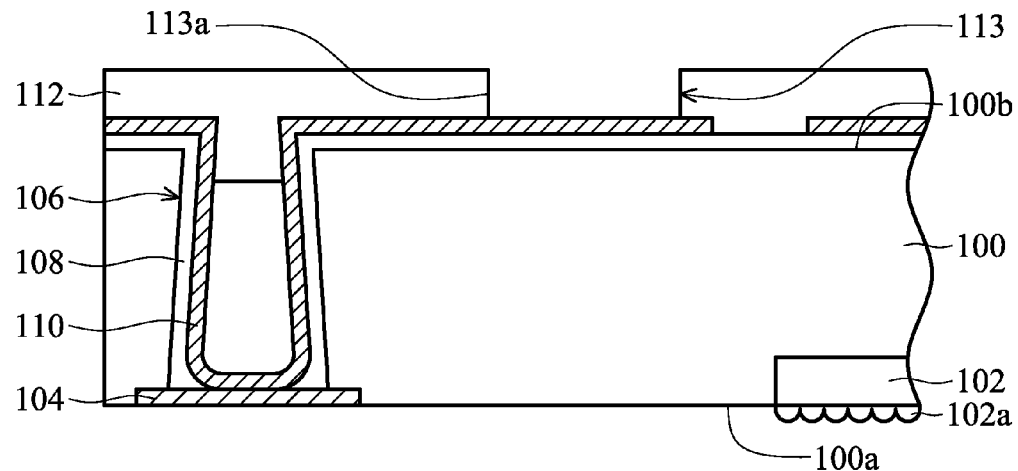
FIGS. 1A-1C are cross-sectional views showing the steps of forming a chip package in accordance with an embodiment of the present invention.
Figure 1B:
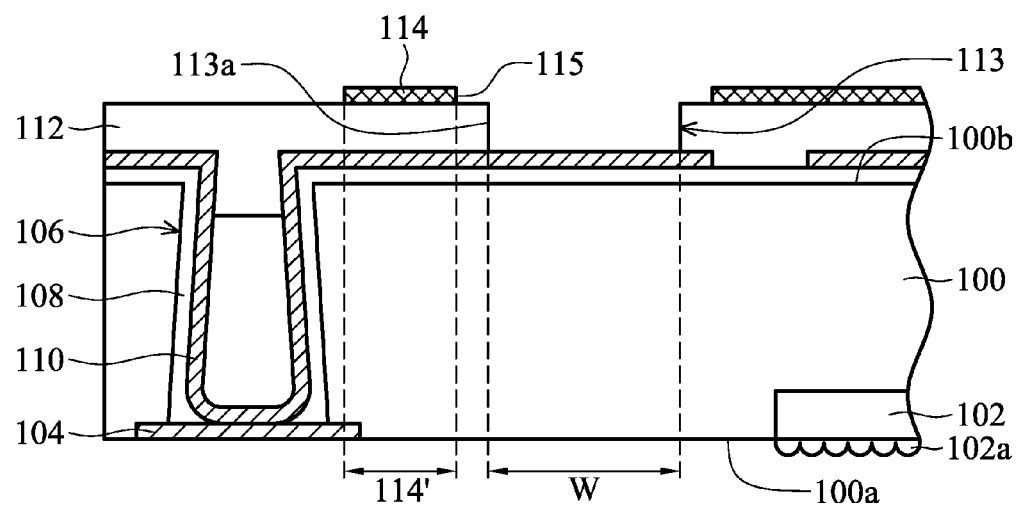
Figure 1C:
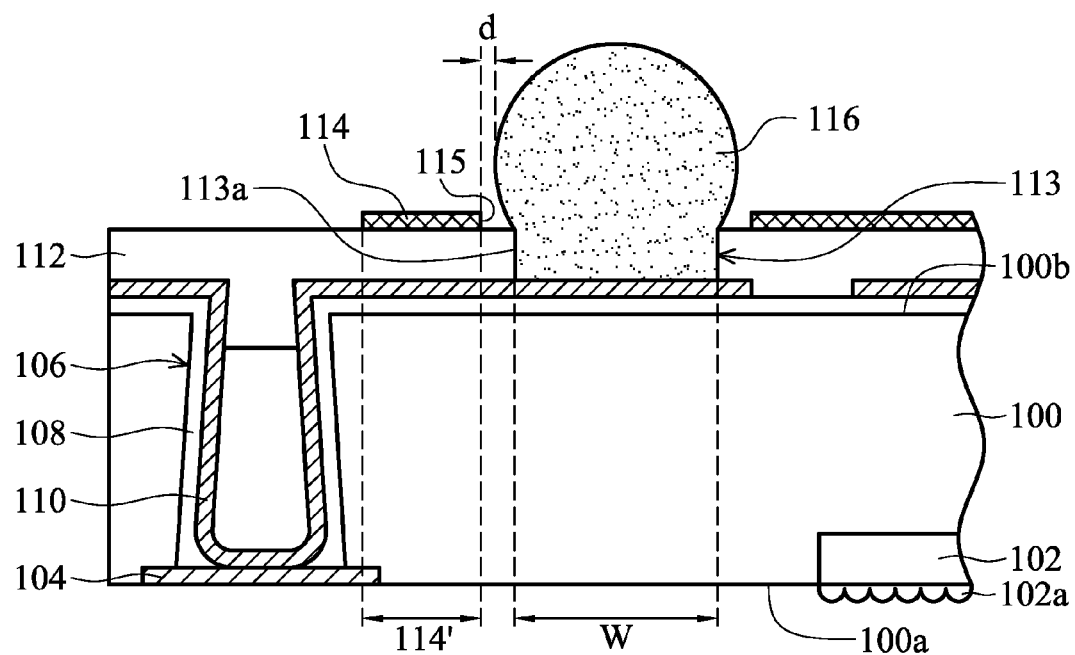

FIGS. 1A-1C are cross-sectional views showing the steps of forming a chip package according to an embodiment of the present invention. As shown in FIG. 1A, a substrate 100 is provided, which is, for example, a semiconductor substrate or a ceramic substrate. In one embodiment, the substrate 100 is a semiconductor wafer (such as a silicon wafer) and a wafer-level packaging process may be performed to reduce fabrication time and fabrication cost. The substrate 100 has a surface 100*a* and a surface 100*b*. For example, the surface 100*a* and the surface 100*b* may be opposite to each other.

As shown in FIG. 1A, in one embodiment, an optoelectronic device 102 is disposed at the surface 100*a*. The optoelectronic device 102 may include, but is not limited to, an image sensor device or a light emitting device. The image sensor device is, for example, a CMOS image sensor device (CIS) or a charge-coupled device (CCD), and the light emitting device is, for example, a light emitting diode device. For example, the optoelectronic device 102 may be electrically connected to a conducting pad 104 formed on the surface 100*a* and the optoelectronic device 102 may be electrically connected to another conducting route through the conducting pad 104. In one embodiment, a microlens array may be disposed on the optoelectronic device 102 to assist in the entering and/or emitting of light.

Although only a single-layered conducting pad 104 is shown in FIG. 1A, a plurality of conducting pads may be stacked and/or arranged on the substrate 100. For example, in one embodiment, the conducting pad 104 is a plurality of conducting pads stacked with each other, at least a conducting pad, or a conducting pad structure formed by at least a conducting pad and at least an interlayer connection structure. In the following embodiments, for convenience, a single-layered conducting pad 104 is shown in the drawings for simplicity.

As shown in FIG. 1A, in one embodiment, a conducting layer 110 electrically connected to the conducting pad 104 may be formed on the substrate 100. The conducting layer 110 may be used to electrically connect the optoelectronic device 102 (through, for example, the conducting pad 104). A conducting route between the conducting layer 110 and the conducting pad 104 may be, for example, a through substrate conducting structure or a redistribution layer extending on an external side of the substrate 100. In the embodiment shown in FIG. 1A, a through substrate conducting structure is illustrated as an example. In one embodiment, the substrate 100 includes a through-hole 106 therein, which extends from the surface 100b towards the surface 100a of the substrate 100. In one embodiment, the through-hole 106 exposes a portion of the conducting pad 104. In addition, the conducting layer 110 extends on a sidewall of the through-hole 106 and the surface 100b of the substrate 100 and is electrically connected to the conducting pad 104. A material of the conducting layer 110 may be, for example, (but is not limited to) a metal material such as copper, aluminum, gold, or combinations thereof.

It should be appreciated that if the material of the substrate 100 (such as silicon) is electrically conductive, an insulating layer needs to be formed between the conducting layer 110 and the substrate 100 to prevent short-circuiting. For example, in the embodiment shown in FIG. 1A, an insulating layer 108 may be optionally formed between the substrate 100 and the conducting layer 110. Similarly, according to the situation, an insulating layer may also be formed between another conducting structure and the substrate 100.

In the embodiment shown in FIG. 1A, the through-hole 106, the insulating layer 108, and the conducting layer 110 together form a through substrate conducting structure. A method for forming a through substrate conducting structure according to an embodiment is then illustrated.

First, a support substrate (not shown) may be disposed on the surface 100a of the substrate 100 to facilitate subsequent fabrication processes. The support substrate may be disposed on the surface 100a of the substrate 100 through, for example, a spacer layer (not shown). Then, the support substrate is used as a support and the substrate 100 is thinned from the surface 100b of the substrate 100 to a suitable thickness. Then, a photolithography process and an etching process are performed on the surface 100b of the substrate 100 to remove a portion of the substrate 100, thus forming the through-hole 106 extending from the surface 100b towards the surface 100a.

In one embodiment, the through-hole 106 preferably has an "inverted angle structure". That is, a width of the through-hole 106 increases along a direction from the surface 100b towards the surface 100a. The etching condition may be adjusted such that the formed through-hole 106 has characteristics of being an "inverted angle structure". The position of the through-hole 106 is preferably located directly on the conducting pad 104 such that at least a portion of the conducting pad 104 is exposed at a bottom of the through-hole 106. In one embodiment, an interlayer dielectric layer may be formed on the conducting pad 104. In this case, another etching process may be performed to remove the interlayer dielectric layer such that the conducting pad 104 is exposed at the bottom of the through-hole 106.

Next, the insulating layer 108 may be formed on the sidewall and the bottom of the through-hole 106 by, for example, chemical vapor deposition. The insulating layer 108 may further extend on the surface 100b of the substrate 100. Then, the insulating layer 108 on the bottom of the through-hole 106 is removed such that the conducting pad 104 is exposed. Because the through-hole 106 has the "inverted angle structure" in one embodiment, the insulating layer 108 on the bottom of the through-hole 108 may be etched and removed by a self-aligning process. No additional patterned mask layer needs to be formed. Fabrication cost and time may be reduced.

Next, the conducting layer 110 is formed on the insulating layer 108 in the through-hole 106. The conducting layer 110 is electrically connected to the conducting pad 104 to be electrically connected to the optoelectronic device 102. The conducting layer 110 may also further extend on the surface 100b of the substrate 100. In one embodiment, a seed layer (not shown) may be formed on the sidewall and the bottom of the through-hole 106 and the surface 100b by, for example, physical vapor deposition. Then, a patterned mask layer (not shown) is formed on the seed layer. The patterned mask layer has a plurality of openings. The openings expose regions where the conducting layer 110 is intended to be formed. Then, a conducting material may be electroplated on the seed layer exposed by the opening by an electroplating process. The patterned mask layer is then removed and an etching process is applied to the seed layer thereunder. Through the mentioned method, the conducting layer 110 having desired conducting patterns may be formed on the surface 100b of the substrate 100 according to requirements. The conducting layer 110 may also be called a redistribution layer.

As shown in FIG. 1A, after the conducting layer 110 is formed, a protection layer 112 is formed on the surface 100b and the conducting layer 110. The protection layer 112 includes, for example, (but is not limited to) a solder mask material, polyimide, or green paint. At least an opening 113 is defined in the protection layer 112, which exposes a portion of the conducting layer 110. In the following process step, a conducting bump will be formed in the opening 113 to serve as a contact between the chip package and an external electronic element (such as a printed circuit board).

Next, as shown in FIG. 1B, a light shielding layer 114 is formed on the protection layer 112. A material of the light shielding layer 114 may be, for example, a metal material, a polymer material, or combinations thereof. In one embodiment, the light shielding layer 114 may be a photoresist layer for the convenience of being patterned. For example, the light shielding layer 114 may be a black photoresist layer. In one embodiment, the light shielding layer 114 is a negative type photoresist layer. In one embodiment, the light shielding layer 114 may be formed on the substrate 100 by, for example, application, and then be patterned as, for example, that shown in FIG. 1B. In addition, the light shielding layer 114 may be a metal material. A metal material layer may be formed on the substrate 100 and be patterned to be a desired light shielding layer by a photolithography process and an etching process.

The light shielding layer 114 may cover the optoelectronic device 102 to assist in blocking and/or absorbing light coming from the outside of the chip package; especially light coming behind the surface 100b of the substrate 100, thus facilitating operation of the optoelectronic device 102. For example, if the optoelectronic device 102 is an image sensor device, the light shielding layer 114 may block light coming from the surface 100b of the substrate 100 to prevent image noise from occurring. Alternatively, if the optoelectronic device 102 is a light emitting device, the light shielding layer 114 may block light coming from the surface 100b of the substrate 100 to prevent the wavelength and/or the intensity of light emitted by the chip package from being affected by external light.

In one embodiment, the light shielding layer 114 is patterned such that a side terminal 115 of the light shielding layer 114 which is closest to the opening 113 is not coplanar with a sidewall 113a of the opening 113. That is, the side terminal 115 of the light shielding layer 114 which is closest to the opening 113 is separated from an edge of the opening 113 by a distance. If the material of the light shielding layer 114 is a polymer material, then making the side terminal 115 of the light shielding layer 114 separated from the edge of the opening 113 by a distance will be helpful for ensuring that substantially no light shielding layer 114 remains in the opening 113 (even if a slight exposure error occurs). Thus, in one embodiment, the light shielding layer 114 does not directly contact with the conducting layer 110. Alternatively, if the material of the light shielding layer 114 is electrically conductive (such as a metal material), the side terminal 115 of the light shielding layer 114 which is separated from the edge of the opening 113 by a distance will not contact with the conducting bump to be formed in the opening 113 to ensure no short-circuiting occurring.

Next, as shown in FIG. 1C, a conducting bump 116 is disposed on the surface 100b of the substrate 100, which is filled into the opening 113 of the protection layer 112 to electrically contact with the conducting layer 110. The conducting bump 116 is, for example, a solder ball. An under bump metallurgy layer may be formed between the conducting bump 116 and the conducting layer 110.

As mentioned above, the light shielding layer 114 is specifically designed such that the side terminal thereof is not coplanar with the sidewall of the opening 113. Thus, the light shielding layer 114 does not contact with the conducting bump 116. In one embodiment, the light shielding layer 114 is separated from the conducting bump 116 by a distance d. In one embodiment, the distance d is about 5% to 8% of a width W of the conducting bump 116. In one embodiment, at least a portion of the through-hole 106 is not covered by the light shielding layer 114. One of the reasons is that the protection layer 112 usually has a recess. If the light shielding layer 114 completely covers the recess of the protection layer 112 directly on the through-hole 106, the light shielding layer 114 may be delaminated. Thus, it is preferable that the through-hole 106 is at least partially not covered by the light shielding layer 114. As shown in the embodiment in FIG. 1C, a projection 114' of the light shielding layer 114 on the surface 100a does not reach the position of the through-hole 104. In addition, in this embodiment, the projection 114' of the light shielding layer 114 on the surface 100a overlaps a projection of the conducting pad 104 on the surface 100a. Thus, the light shielding layer 114 covers a portion of the conducting pad 104.

Figure 4A:
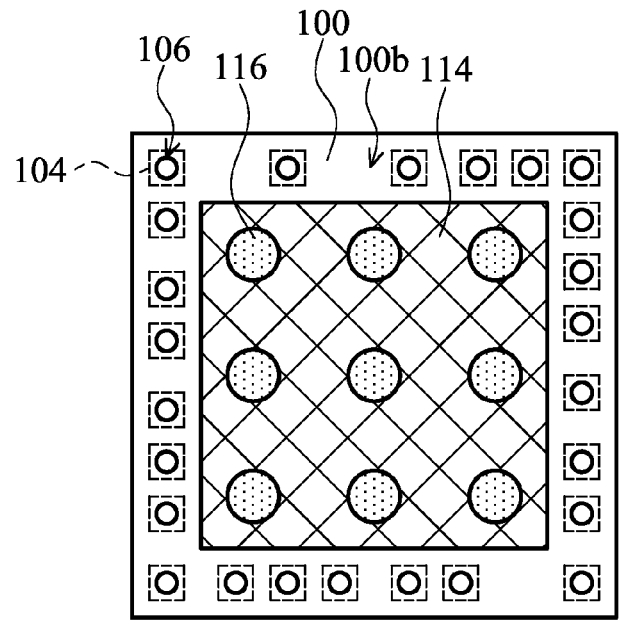
FIGS. 4A-4D are top views showing the surfaces of the substrates of chip packages in accordance with embodiments of the present invention.
Figure 4B:
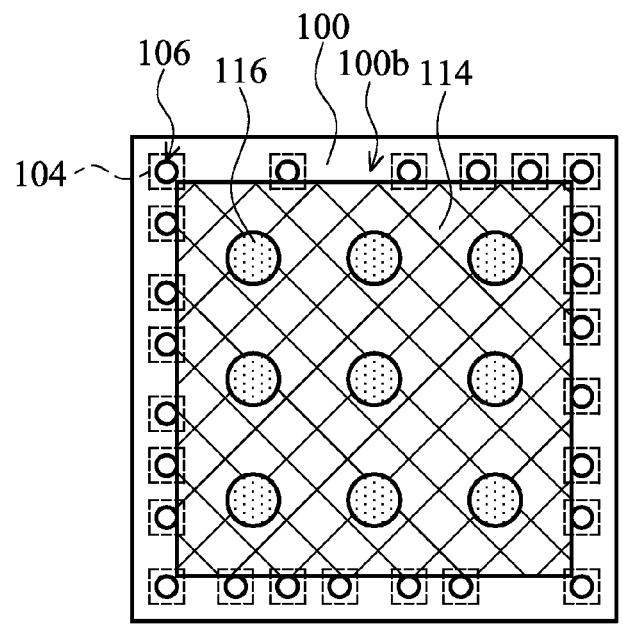

FIGS. 4A-4D are top views showing the surfaces 100b of the substrates 100 of chip packages according to a plurality of the embodiments of the present invention, wherein same or similar reference numbers are used to designate same or similar elements. Among them, FIG. 4B corresponds to the embodiment shown in FIG. 1C. As shown in FIG. 4B, a plurality of conducting bumps 116 and through substrate conducting structures (including through-holes 106 and conducting layers therein) are disposed at the surface 100b of the substrate 100. Typically, in a chip package, the through-holes 106 and the conducting pads 104 are disposed in a periphery region of the chip (or the substrate 100). In this embodiment, the light shielding layer 114 covers a portion of the conducting pad 104 and completely does not cover the through-hole 106 substantially.

Figure 3:
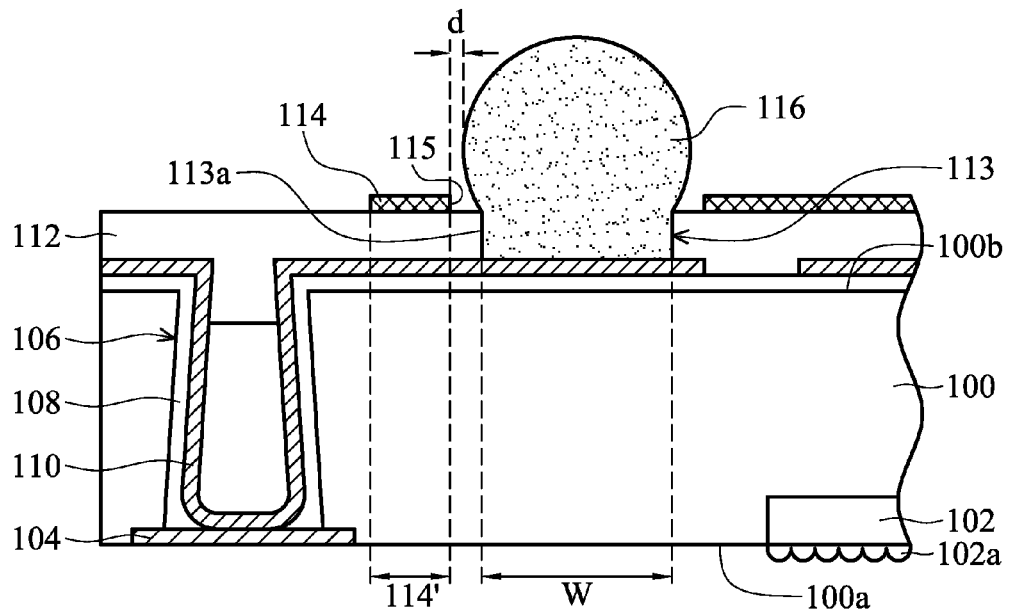
FIG. 3 is a cross-sectional view showing a chip package in accordance with an embodiment of the present invention.

However, arrangements of the light shielding layer of the embodiments of the invention are not limited thereto. For example, in the embodiment shown in FIG. 4A, the light shielding layer 114 completely does not cover the through-hole 106 and the conducting pad 104. FIG. 3 is a cross-sectional view showing a chip package according to an embodiment of the present invention, which corresponds to the embodiment shown in FIG. 4A, wherein same or similar reference numbers are used to designate same or similar elements. As shown in FIG. 3, the projection 114' of the light shielding layer 114 on the surface 100a does not reach the through-hole 106 and the conducting pad 104.

Figure 2:
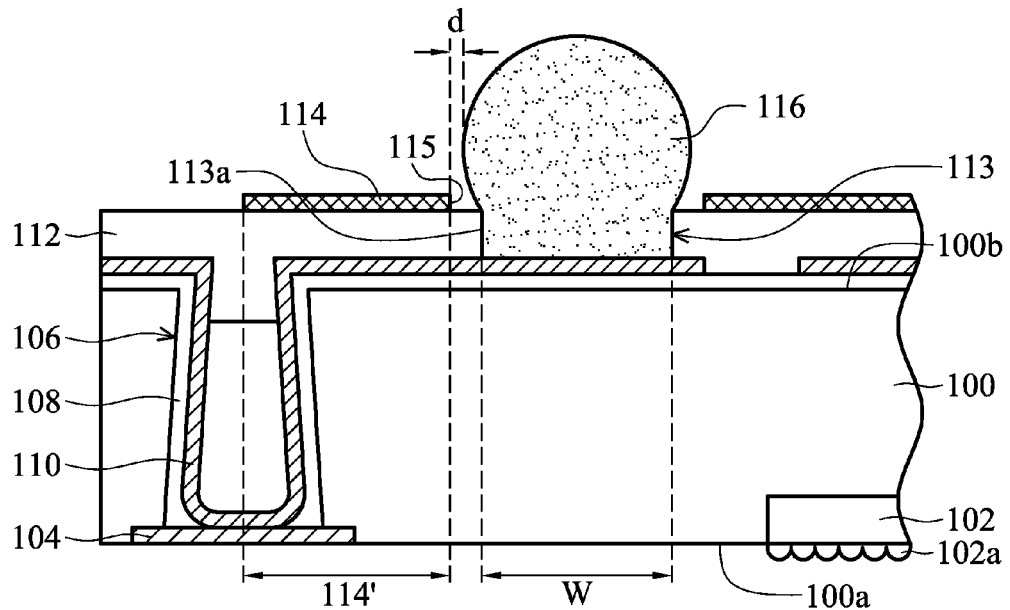
FIG. 2 is a cross-sectional view showing a chip package in accordance with an embodiment of the present invention.
Figure 4C:
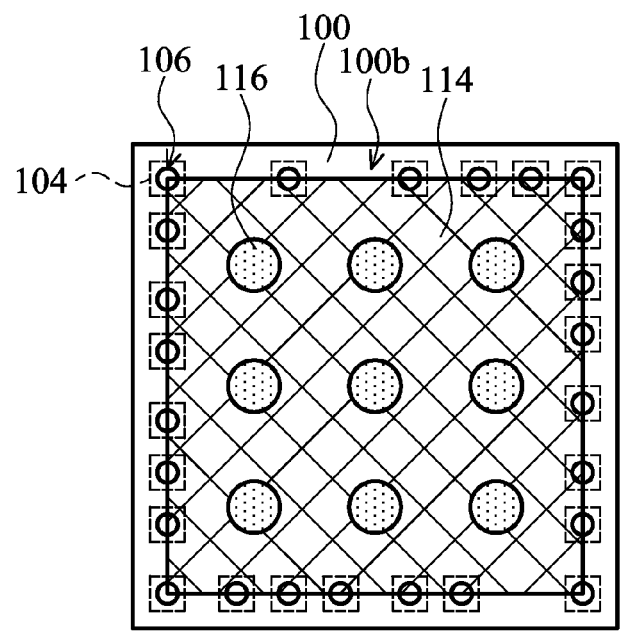

In the embodiment shown in FIG. 4C, the light shielding layer 114 covers a portion of the through-hole 106 and a portion of the conducting pad 104. FIG. 2 is a cross-sectional view showing a chip package according to an embodiment of the present invention, which corresponds to the embodiment shown in FIG. 4C, wherein same or similar reference numbers are used to designate same or similar elements. As shown in FIG. 2, the projection 114' of the light shielding layer 114 on the surface 100a reaches a portion of the through-hole 106 and the conducting pad 104. Although the projection layer 112 directly on the through-hole 106 may have a recess such that the light shielding layer 114 may be easily delaminated, the light shielding layer 114 does not completely cover the through-hole 106, and thus the probability of delamination may be reduced.

Figure 4D:
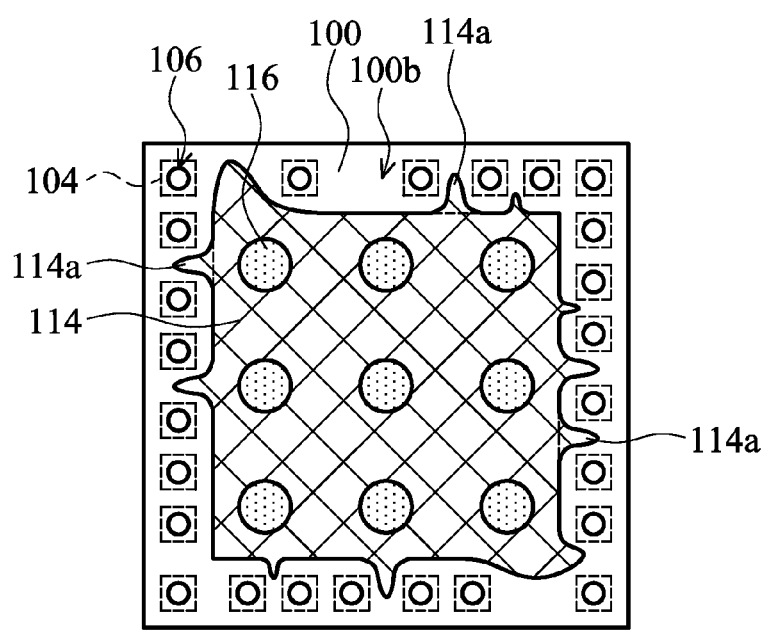

In the embodiment shown in FIG. 4D, the light shielding layer 114 may further include a protruding portion 114a. The protruding portion 114a may be located between two adjacent through substrate conducting structures.

In the chip package of the embodiments of the invention, the light shielding layer is used to block and/or absorb external light such that operation of the chip package is better. In the chip package of the embodiments of the invention, the light shielding layer does not contact with the conducting bump, further improving the reliability of the chip package and preventing short-circuiting.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A chip package, comprising:
   a substrate having a first surface and a second surface;
   an optoelectronic device disposed at the first surface;
   a protection layer disposed on the second surface of the substrate, wherein the protection layer has an opening;
   a conducting bump disposed on the second surface of the substrate and filled in the opening;
   a conducting layer disposed at a first side of the protection layer between the protection layer and the second surface of the substrate, wherein the conducting layer electrically connects the optoelectronic device to the conducting bump; and a light shielding layer disposed on a second side of the protection layer opposite the conducting layer, wherein the light shield layer is separated from the conducting bump to define a gap between the conducting bump and the light shielding layer and surrounding the opening in the protection layer, wherein the gap is not filled with an electrically conductive material, and wherein the light shielding layer does not contact with the conducting bump and does not extend to cover any sidewall between the first and second sides of the light shield layer.

2. The chip package as claimed in claim 1, further comprising a through substrate conducting structure comprising:
a through-hole extending from the second surface towards the first surface; and
an insulating layer formed on a sidewall of the through-hole and extending on the second surface of the substrate,
wherein the conducting layer extends on the insulating layer in the through-hole.

3. The chip package as claimed in claim 2, wherein a width of the through-hole increases along a direction from the second surface towards the first surface.

4. The chip package as claimed in claim 2, wherein at least a portion of the through-hole is not covered by the light shielding layer.

5. The chip package as claimed in claim 4, wherein the light shielding layer completely does not cover the through-hole.

6. The chip package as claimed in claim 2, further comprising a conducting pad formed in the substrate, wherein the conducting pad electrically connects the optoelectronic device to the conducting layer.

7. The chip package as claimed in claim 6, wherein the through-hole exposes the conducting pad.

8. The chip package as claimed in claim 7, wherein the light shielding layer covers a portion of the conducting pad.

9. The chip package as claimed in claim 7, wherein the light shielding layer completely does not cover the conducting pad.

10. The chip package as claimed in claim 2, further comprising a second through substrate conducting structure, wherein the light shielding layer comprises a protruding portion located between the through substrate conducting structure and the second through substrate conducting structure.

11. The chip package as claimed in claim 1, wherein the optoelectronic device comprises an image sensor device or a light emitting device.

12. The chip package as claimed in claim 1, wherein the light shielding layer and the conducting bump are separated from each other by a distance, and the distance is about 5% to about 8% of a width of the conducting bump.

13. The chip package as claimed in claim 1, further comprising a microlens array disposed on the optoelectronic device.

14. The chip package as claimed in claim 1, wherein the light shielding layer comprises a metal material, a polymer material, or combinations thereof.

15. The chip package as claimed in claim 1, wherein the conducting bump comprises a solder ball.

16. The chip package as claimed in claim 1, wherein a side terminal of the light shielding layer which is closest to the protection layer is not coplanar with a sidewall of the opening.

17. The chip package as claimed in claim 1, wherein the light shielding layer covers the optoelectronic device.

18. The chip package as claimed in claim 1, wherein there is substantially no light shielding layer in the opening of the protection layer.

19. The chip package as claimed in claim 1, wherein the light shielding layer does not directly contact with the conducting layer.

20. The chip package as claimed in claim 2, wherein the through-hole is located in a periphery region of the substrate.

21. A chip package, comprising:
a substrate having a first surface and a second surface;
an optoelectronic device disposed at the first surface;
a protection layer disposed on the second surface of the substrate, wherein the protection layer has an opening;
a conducting bump disposed on the second surface of the substrate and filled in the opening;
a conducting layer disposed between the protection layer and the second surface of the substrate, wherein the conducting layer electrically connects the optoelectronic device to the conducting bump; and
a light shielding layer disposed on a side of the protection layer opposite the conducting layer, wherein the light shield layer has an opening that surrounds the conducting bump that fills the opening in the protection layer to define an annular gap surrounding the conducting bump such that the light shield layer is separated from the conducting bump, and wherein the gap is not filled with an electrically conductive material.

* * * * *